US005790220A

United States Patent [19]

Sakamoto et al.

[11] Patent Number: 5,790,220
[45] Date of Patent: Aug. 4, 1998

[54] LIQUID CRYSTAL DISPLAY AND METHOD OF FABRICATING SAME WITH A BLACK RESIN FILM COVERED AN EXPOSED PORTION OF THE WIRING REGION ON THE OUTSIDE OF THE SEALING LAYER

[75] Inventors: Kazunori Sakamoto, Ohtsu; Tohru Nishimura, deceased, late of Hikone, both of Japan, by Kyoko Nishimura, legal representative

[73] Assignee: International Business Machines Corporation, Armonk, N.Y.

[21] Appl. No.: 724,994

[22] Filed: Oct. 3, 1996

[30] Foreign Application Priority Data

Oct. 3, 1995 [JP] Japan ................... 7-256024

[51] Int. Cl.$^6$ .................... G02F 1/1333; G02F 1/1345
[52] U.S. Cl. .................. 349/110; 349/152; 349/149
[58] Field of Search .................. 349/110, 152, 349/149

[56] References Cited

U.S. PATENT DOCUMENTS

| 4,826,297 | 5/1989 | Kubo et al. | 349/151 |
| 5,434,688 | 7/1995 | Saitoh et al. | 349/110 |
| 5,510,916 | 4/1996 | Takahashi | 349/110 |

*Primary Examiner*—William L. Sikes
*Assistant Examiner*—Julie Ngo
*Attorney, Agent, or Firm*—Ronald L. Drumheller

[57] ABSTRACT

A liquid crystal display is constructed such that a black resin film is formed on the wiring region outside of the sealing compound that seals the liquid crystal between opposed substrates. This results in preventing corrosion of the leading fine wire between an OLB electrode and a pixel on the liquid crystal display panel and thereby prevents breaking of wires formed on the array substrate on the outside of the sealing compound and short-circuiting between the wires. The black resin film forms an excellent protective layer in place of the conventional silicon resin coating step designed for this purpose.

11 Claims, 5 Drawing Sheets

5,790,220

LIQUID CRYSTAL DISPLAY AND METHOD OF FABRICATING SAME WITH A BLACK RESIN FILM COVERED AN EXPOSED PORTION OF THE WIRING REGION ON THE OUTSIDE OF THE SEALING LAYER

BACKGROUND OF THE INVENTION

1. Field of the Invention:

The present invention relates to a liquid crystal display and a method of fabricating the a liquid crystal display, and more particularly to a liquid crystal display and a method of fabricating a liquid crystal display which realize the corrosion prevention of the leading fine wire between an OLB output Line Buffer electrode and a pixel on the liquid crystal display panel.

2. Related Art:

It may safely be said that a reduction in the cost of the liquid crystal display depends upon how much production efficiency is increased in the fabricating steps or how much the cost of materials is reduced. It leaves no room for doubt that a reduction in the number of fabricating steps, even a slight reduction, results in an increase in production efficiency and a reduction in the cost of materials and is effective in a reduction in cost. In addition, the reduction in the number of fabricating steps is effective in enhancements of yield and product quality.

The liquid crystal display (LCD panel) is fabricated through various kinds of fabricating steps. As main fabricating steps, first there is an array step where patterns are formed on a glass substrate and an array substrate is fabricated, then there is a cell step where the array substrate and a color filter substrate are bonded together to fill in liquid crystal which is sealed with a sealing compound, and finally there is a module fabricating step where a tape automated bonding (hereinafter referred to as TAB) and a printed-substrate soldering are carried out. In the module fabricating step, mainly a mounting technique and an assembling technique are essential, unlike the array and cell steps where a physical or chemical processing technique is essential.

In the module fabricating step in the case of the active matrix type liquid crystal display, a driver IC for driving a liquid crystal cell is mounted on the liquid crystal panel after the cell step. The driver IC is carried on a tape carrier package (hereinafter referred to as TCP) by the TAB method.

The wiring on one terminal side of the TCP is connected through an anisotropic conductive film (hereinafter referred to as an ACF) to each OLB electrode section on the array substrate of the liquid crystal panel. Each OLB electrode section (liquid crystal drive circuit connection section) is connected to the signal line (data line) or gate line (scanning line) on the array substrate. The other terminal of the TCP is connected, by a soldering method, to the wiring on the printed substrate positioned in the circumference of the liquid crystal panel.

The method of connecting the driver circuit, based on the TAB method, has the advantage that it can cope with a reduction in the space between the wires on the glass substrate resulting from the increase in the size and the high-density requirement of the liquid crystal panel and also can cope with the thinning of the liquid crystal panel because the flexible tape of the TCP can be bent and used. It is possible in the TAB method to reduce the inter wiring pitch between the liquid crystal panel and the TCP to less than 70 μm and in the future it will also be possible to reduce to the order of 60 μm.

A large number of gate lines and data lines are drawn out and wired on the array substrate on the outside region of the sealing compound formed on the circumference of two opposed glass substrates of the liquid crystal panel, and an OLB electrode is formed on the end portion of the wiring. In addition, an extremely thin passivation film of about 1000 Åis formed on the upper layer of the wiring layers.

However, in the case of the protective film of such thickness, it may safely be said that wirings are weathered and exposed to the air, since the gate and data lines outside the sealing compound are well contacted to ambient atmosphere. Therefore, if foreign substances or dewdrops adhere to the gate and data lines during the module fabricating step or after the liquid crystal panel is fabricated to be a final product, corrosion starts therefrom resulting to a brakeage of wire occasionally. Also, because of the reduction in the wiring pitch, there is a possibility that the adhesion of conductive foreign substances to the wiring causes an electrical short-circuit.

To prevent such failure, a step of coating silicon resin on the wiring on the region between the ACF, which connects the OLB electrode with the TCP on the array substrate, and the TCP is added after the process of connecting wiring on the array substrate with the driver circuit, utilizing TAB method.

Silicon resin is being filled into from the gap between the TCP and the color filter substrate, to coat the gate and data lines on the array substrate extending from the sealing compound end to the ACF end of the TAB.

With the silicon resin coating formed in this step, foreign substance are prevented from adhering to the wiring, and also the corrosion of the wiring and the short-circuit between wires are prevented by preventing dewdrops from occurring directly on the wiring.

It is ideal to coat silicon resin on the gate and data lines on the array substrate extending from the sealing compound end to the ACF end of the TAB. However, the gap between the TCP end and the color filter substrate end must be narrowed in order to meet the miniaturization and thinning requirements of the liquid crystal display itself while improving an increase in the size of the display region of the liquid crystal display in recent years. In addition, the distance between the array substrate and the color filter substrate is becoming shorter. For this reason, it is becoming difficult to fill silicon resin sufficiently and to cover over the entire portion from the ACF end to the sealing compound end.

The problem will be described with FIGS. 8 through 10. FIG. 8 illustrates the plane of a liquid crystal display I fabricated by a conventional module fabricating step. A color filter substrate 4 is formed inside the circumference of an array substrate 2. A sealing compound 6 is further formed inside the circumference of the color filter substrate 4. The inner region surrounded by the sealing compound 6 is an image displaying region, on which a large number of data lines and gate lines 10 cross one another and a large number of pixels are formed in the form of a matrix.

The lead line on one side of each of a plurality of TCPs 12 each carrying a driver circuit IC 30 thereon is bonded through the ACF to an OLB electrode formed on the circumferential region of the array substrate 2. Although each TCP 12 is provided, for example, 200 wires 10 formed on the array substrate 2, not all the wires 10 are shown in FIG. 8. A printed substrate 32 is mounted on the other side of the TCP 12 by soldering. Silicon resin 16 is coated in order to protect the wires 10 drawn out on the array substrate 2 between the TCP 12 and the sealing compound 6.

The region enclosed by a circle 34 of FIG. 8 is shown in FIG. 9 with an enlarged scale. Also, the A—A cross section of FIG. 9 is shown in FIG. 10. FIGS. 9 and 10 are diagrams showing an example of the silicon resin coating of the region between the TCP end and the color filter substrate end of a conventional liquid crystal display. As shown in both figures, the wiring 10 of the data lines or gate lines is formed on the array substrate 2 of the liquid crystal display so that it runs under the sealing compound 6 sealing liquid crystal 8 and extends from the display region to the OLB electrode section 15. A color filter substrate 4 is bonded to the array substrate 2 with the sealing compound 6. The upper portion of the OLB electrode section 15 on the array substrate is adhered to the TCP 12 by the ACF.

The region D shown in FIG. 10, i.e., the region between the end of the ACF 14 and the end of the sealing compound 6, is a region where corrosion of wiring or a short-circuit may occur. The distance A from the end of the TCP 12 to the end of the ACF 14 is about 0.3 to 0.4 mm, and the distance C from the end of the color filter substrate 4 to the end of the sealing compound 6 is about 0.5 mm. The gap B from which silicon resin is being filled into is about 0.5 mm. Also, the height of the sealing compound 6 is about 5 µm.

Because silicon resin is filled into to coat on a narrow region as described, the silicon resin 16 does not expand sufficiently, thereby causing wiring regions E and F which are not coated with the silicon resin 16. The distances of the regions E and F are about 0.2 to 0.3 mm and 0.3 to 0.4 mm, respectively.

Thus, because of the increase in the display region of the liquid crystal display in recent years and the thin-size and miniaturization of the display itself, a region where the insufficient protection of wiring by silicon region coating occurs. Consequently, this results in a reduction in the yield of the liquid crystal display and an increase in fabrication cost.

Furthermore, under the low cost requirement of the liquid crystal display in recent years, the silicon resin coating in the module fabricating step has problems in the cost of materials such as silicon resin, the maintenance cost of facilities such as devices and tools, and further the personnel cost needed for repairing the fabricating defect produced in the silicon resin coating step, or in the delay of the appointed data of delivery, etc.

SUMMARY OF THE INVENTION

An object of the present invention is to provide a liquid crystal display and a method of fabricating a liquid crystal display which are capable of preventing the breaking of wires formed on the array substrate at the outside of the sealing compound, as well as preventing the shortcircuit between the wires.

Another object of the present invention is to provide a liquid crystal display and a method of fabricating a liquid crystal display which are capable of forming an excellent protective layer instead of the silicon resin coating process as is described for preventing the breaking of wires formed on the array substrate at the outside of the sealing compound as well as preventing the short-circuit between the wires.

The foregoing objects are achieved by a liquid crystal display comprising: a wiring region formed on an array substrate; a sealing compound provided between the array substrate and a substrate opposed to the array substrate to enclose liquid crystal; and a black resin film formed on a portion of the wiring region outside the sealing compound.

In addition, the foregoing objects are achieved by a liquid crystal display comprising: a wiring region formed on an array substrate; a sealing compound provided between the array substrate and a substrate opposed to the array substrate to enclose liquid crystal; and a black resin film formed on the wiring region between the sealing compound and a liquid crystal drive circuit connection section.

Further, the foregoing objects are achieved by the liquid crystal display wherein the black resin film comprises a resin film having black pigments dispersed or a resin film having carbon blacks dispersed.

Finally, the foregoing objects are achieved by a method of fabricating a liquid crystal display, comprising the steps of: forming a wiring layer on a substrate; coating a black resin film on an entire surface of the substrate and patterning the black resin film; and forming a black matrix on an image display region of the substrate with the patterned black resin film and at the same time forming a protective layer on the wiring layer other than the image display region, the black matrix functioning as a light-shielding film.

DESCRIPTION OF THE PREFERRED EMBODIMENTS

Figure 1:
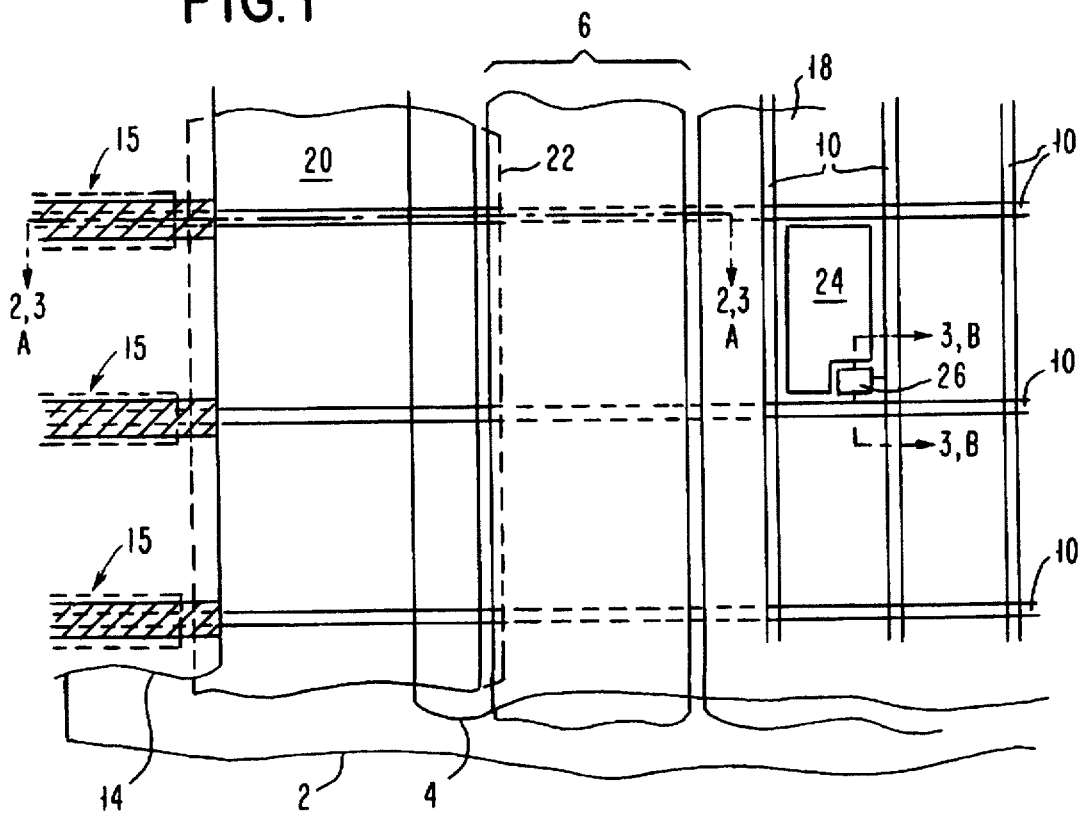
FIG. 1 is a part plan view of a liquid crystal display in accordance with an embodiment of the present invention.
Figure 2:
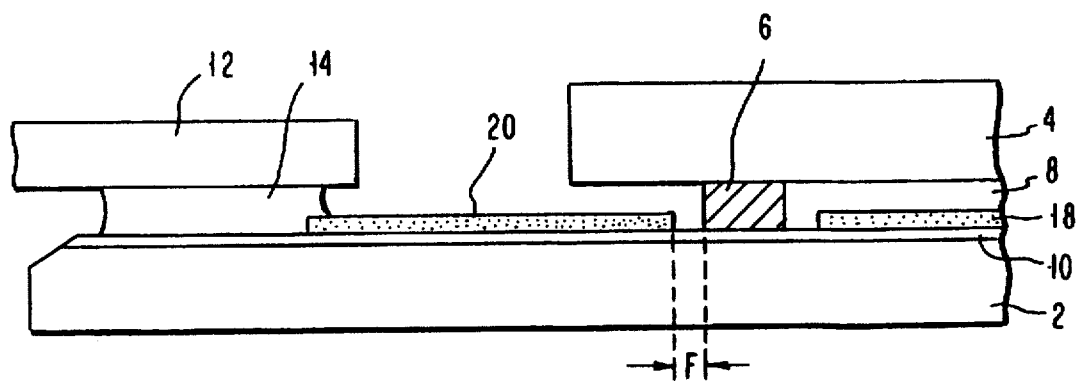
FIG. 2 is a part sectional view taken along line A—A of FIG. 1.
Figure 9:
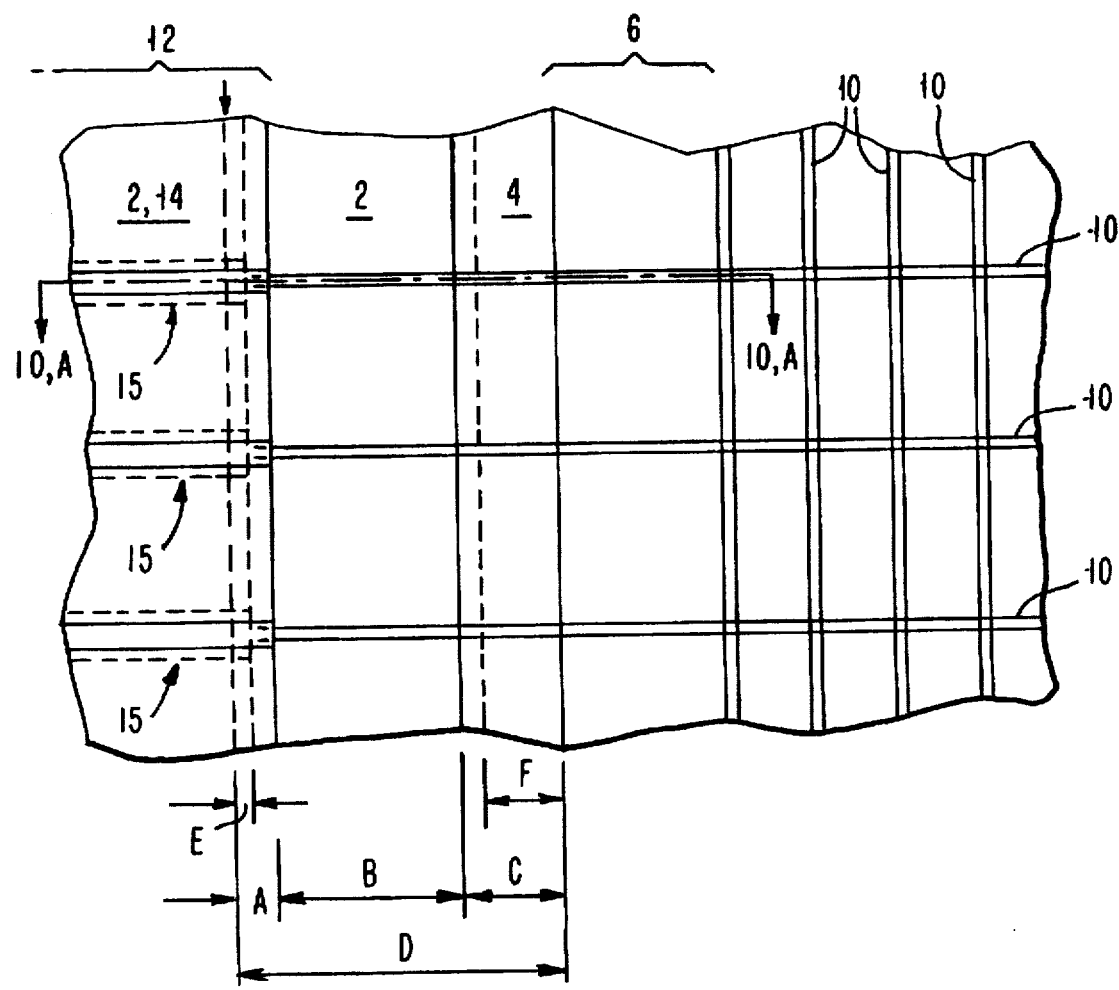
FIG. 9 is an enlarged part plan view of the conventional liquid crystal display.

A preferred embodiment of the present invention will be described with FIGS. 1 and 2. FIG. 1 is an enlarged part plan view of the panel circumferential portion of a liquid crystal display according to the present invention, and corresponds to FIG. 9 showing the conventional liquid crystal display. FIG. 2 is a cross-sectional view taken along line A—A of FIG. 1. In the embodiment of the present invention there is shown an example of a case where a pigment dispersing resin for black matrix formation is formed on the wiring of a region between the TCP and sealing compound of the liquid crystal display.

As shown in FIGS. 1 and 2, a wiring 10 of the data line or gate line, formed on the array substrate 2 of the liquid crystal display, is formed so as to run under a sealing compound 6 sealing liquid crystal 8 and extend from the display region to an OLB electrode 15. The region surrounded by the wiring 10 of the gate and data lines is a pixel region, and a display electrode 24 is formed on the array substrate 2 of the pixel region. Each display electrode 24 is provided with a switching element, such as a thin film transistor (TFT) 26, at the position of intersection between the gate line and the data line. The color filter substrate 4 is bonded through the sealing compound 6 to the array substrate 2. A TCP 12 is bonded through an ACF 14 to the OLB electrode 15.

Between the side end portion of the ACF 14 opposed to the color filter substrate 4 and the side end portion of the sealing component 6 opposed to the ACF 14, an organic resin layer 20 of thickness, for example, 2 μm, comprising a black pigment dispersed, is formed on the wiring 10 on the array substrate 2. The black resin layer 20 functions as a protective film of the wiring 10 preventing foreign substances or dewdrops from adhering to the wiring 10. One end portion of the black resin layer 20 is formed so as to be buried in the lower end portion of the ACF 14, so there is no possibility that the wiring 10 on the array substrate 2 is being weathered and exposed at the ACF side to the air.

The distance F between the end portion of the sealing compound 6 and the end portion of the black resin layer 20 is about 0.2 mm or so in consideration of an alignment error. Even if the end portion of the black resin layer 20 is extended into the sealing compound 6, the distance F can be made to be zero if a cell gap of a region where the liquid crystal is sealed can be maintained at a predetermined thickness. The case where the end portion of the black resin layer 20 extends into the sealing compound 6 is indicated by broken lines 22 in FIG. 1. If done like this, the wiring 10 on the array substrate 2 can be completely protected between the side end portion of the ACF 14 opposed to the color filter 4 and the side end portion of the sealing compound 6 opposed to the ACF by the black region layer 20.

The black resin layer 20 is formed with the same material and at the same time as the black matrix (light-shielding layer) 18 formed on the array substrate side of the pixel region where the liquid crystal 8 is sealed.

Figure 3:
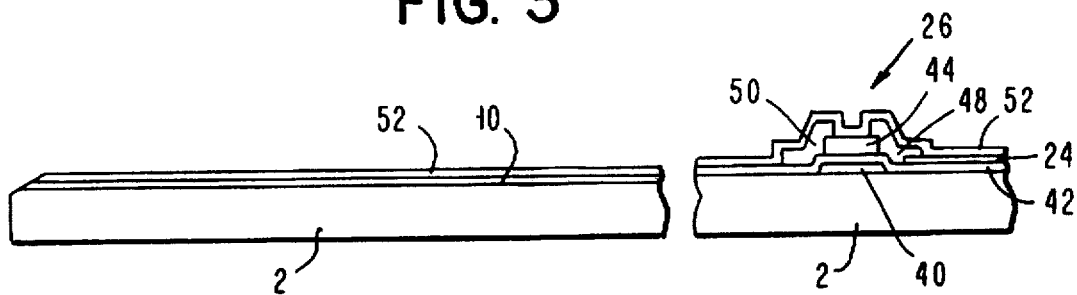
FIG. 3 is a diagram used to explain a method of fabricating a liquid crystal display of an embodiment of the present invention.

An embodiment of a method of fabricating a liquid crystal display of the present invention will be described with FIGS. 3 through 7. FIG. 3 is an explanatory diagram of a fabrication method started from the state where the wiring 10 of the gate and data lines, the pixel electrodes 24, and the TFTs 26 have already been formed on the array substrate in the array step. The left side in FIG. 3 is an A—A sectional view of FIG. 1 and illustrates the circumferential region of the array substrate 2, while the right side is a B—B sectional view of FIG. 1 and illustrates the region of the TFT. It is noted that the scales of the right and left sides in FIG. 3 are not always the same for making an understanding of the explanation easier.

In FIG. 3 the TFT 26 has been formed on the pixel formed region on the array substrate 2. Briefly explaining the structure, a gate insulation film 42 comprising a silicon oxide film or silicon nitride film, etc., is formed on a gate electrode 40 formed on the array substrate 2. The gate electrode 40 is connected to the gate line 10.

A channel region 44 composed of amorphous silicon is formed on the gate insulation film 42 on the gate electrode 40, and a drain electrode 50 and a source electrode 48 are formed on both sides of the channel region 44. The drain electrode 50 is connected to the data line 10, and the source electrode 48 is connected to the display electrode 24. A passivation film 52 of about 1000 Å thick is formed over the entire surface of the array substrate 2.

Figure 4:
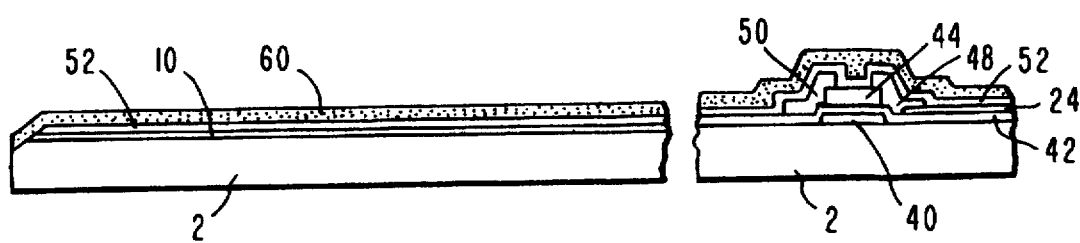
FIG. 4 is a diagram used to explain the method of fabricating a liquid crystal display of the embodiment of the present invention.

With this state, as shown in FIG. 4, for example a black negative photoresist 60, where a photopolymerization initiator and black pigment (a term of genus including carbon black, etc., for species) are added, for example, to acrylic resins, is formed on the entire surface of passivation film 52 by coating the photoresist 60 at a thickness of about 2 μm by a spin coater so that the optical density becomes, for example, greater than 2.5, and then followed by a pre-exposure baking.

Figure 5:
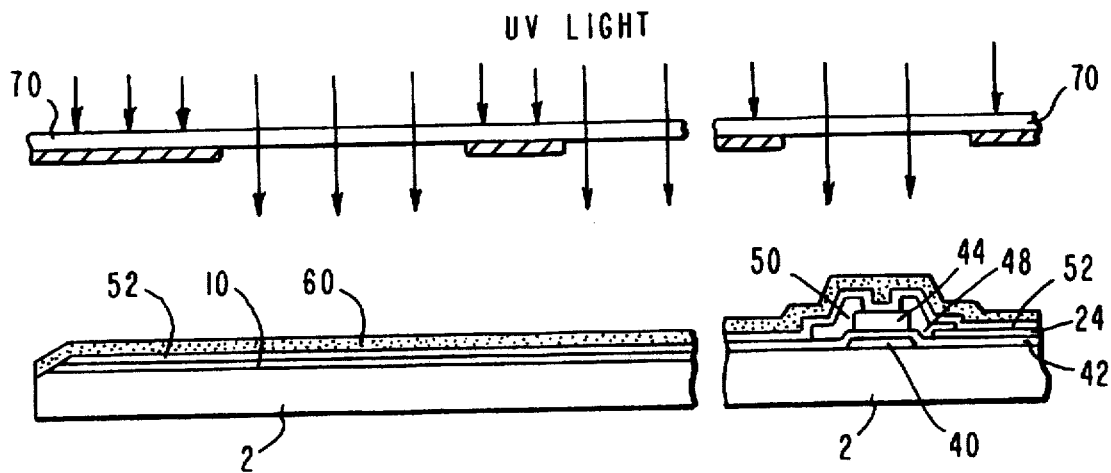
FIG. 5 is a diagram used to explain the method of fabricating a liquid crystal display of the embodiment of the present invention.

Then, the black negative photoresist 60 is exposed to ultraviolet light with a mask 70 formed so that a black matrix is formed. The mask 70 has patterns so that a protective layer of the wiring 10 such as that shown in FIGS. 1 and 2 is formed on the circumferential portion of the array 2 with the black negative photoresist 60 (FIG. 5).

Figure 6:
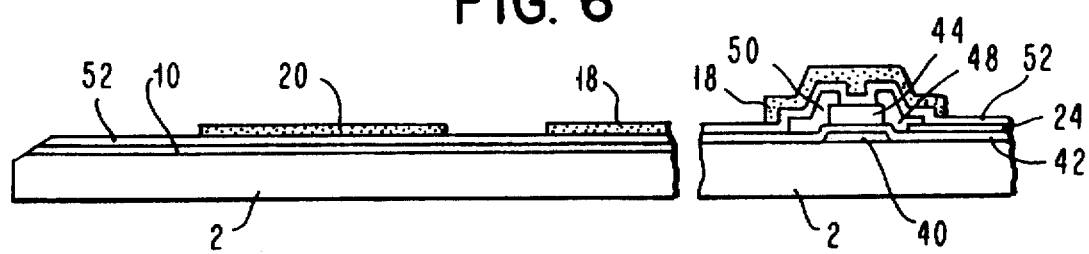
FIG. 6 is a diagram used to explain the method of fabricating a liquid crystal display of the embodiment of the present invention.

If the black negative photoresist 60 is exposed and patterned with the mask 70, the black matrix 18 can be formed and at the same time the black resin layer 20 composed of a pigment dispersing region for black matrix formation can be formed on the wiring of the circumferential portion of the array substrate 2 (FIG. 6).

Figure 7:
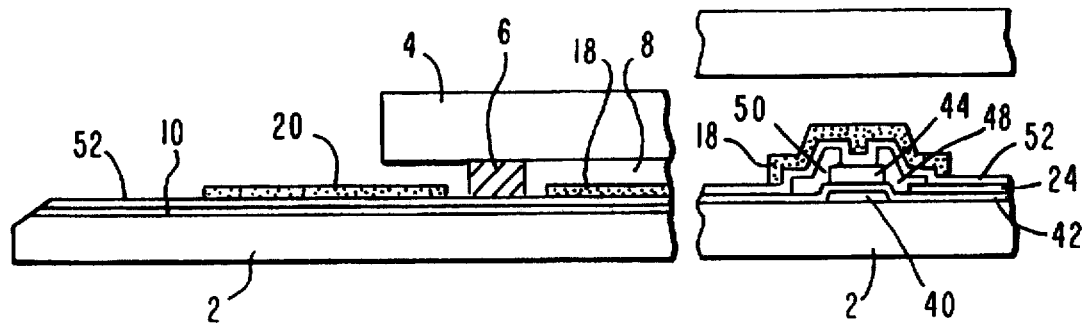
FIG. 7 is a diagram used to explain the method of fabricating a liquid crystal display of the embodiment of the present invention.
Figure 10:
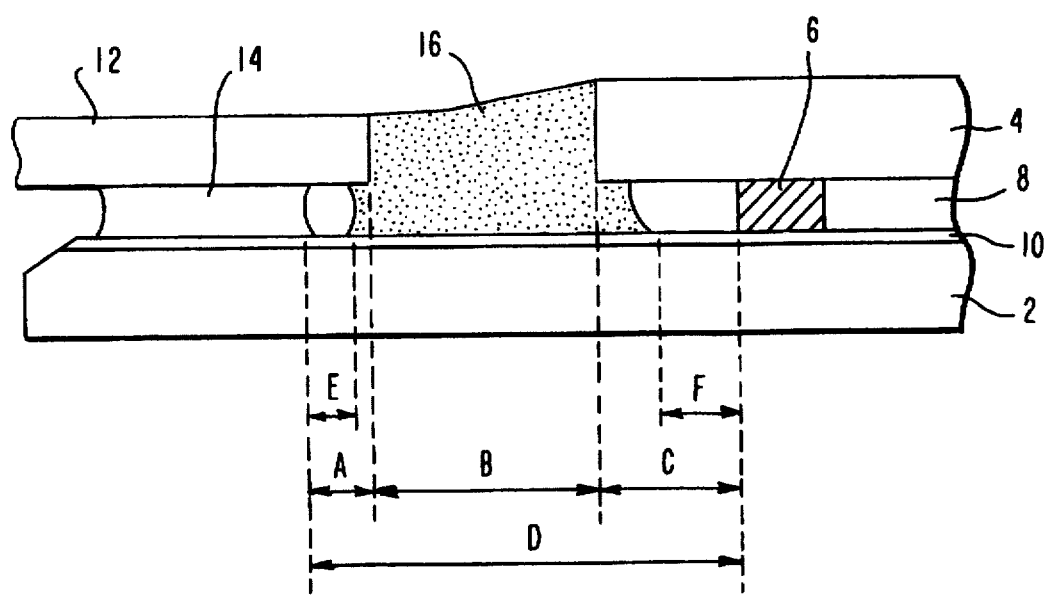
FIG. 10 is a part sectional view taken along line A—A of FIG. 9.
Figure 8:
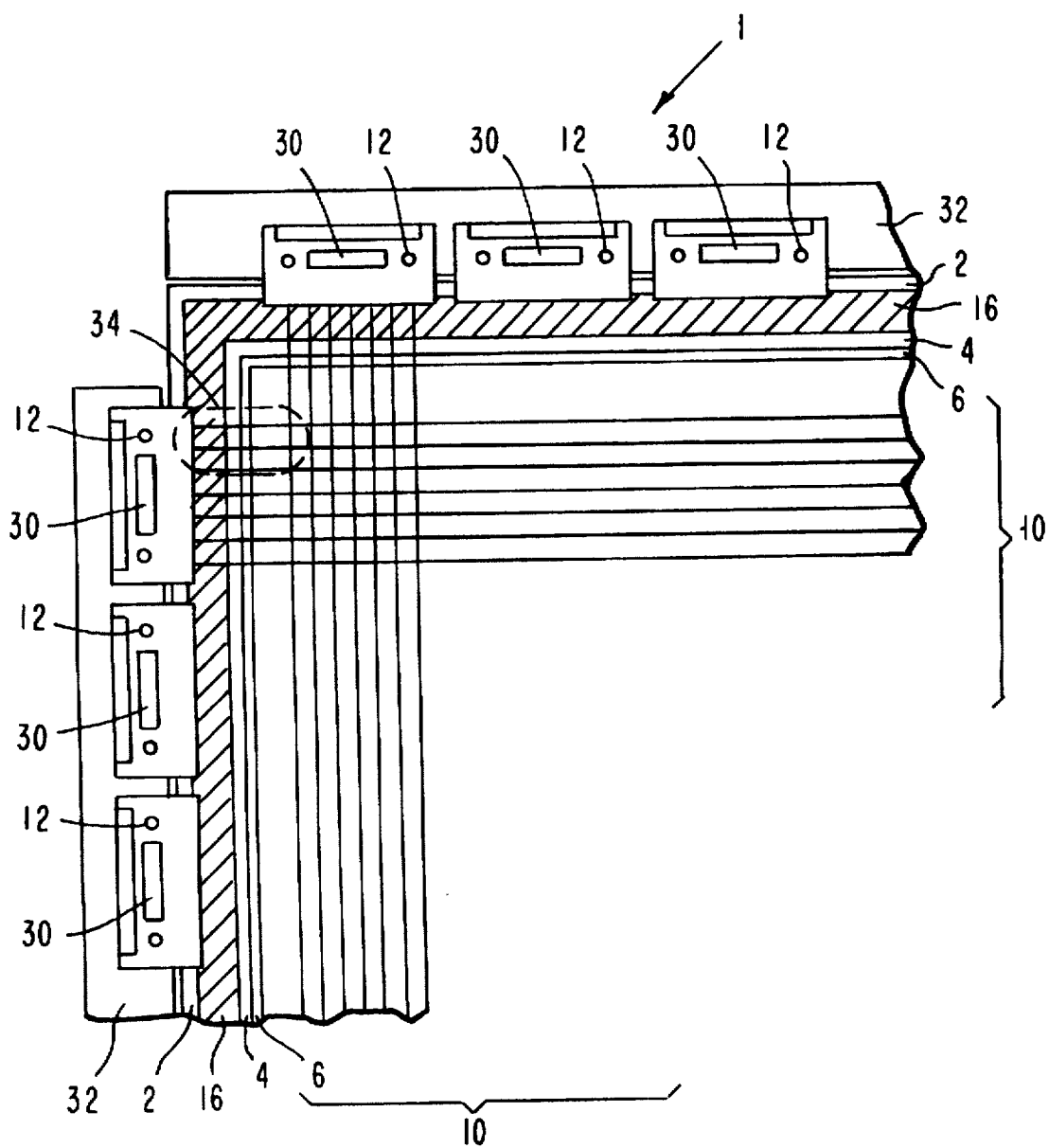
FIG. 8 is a part plan view of a conventional liquid crystal display.

Next, the array-formed array substrate 2 and the color filter substrate 4 are bonded with the sealing compound 6 to enclose the liquid crystal 8, which means the cell step is completed (FIG. 7).

Finally, in the module fabricating step the wires on one terminal side of TCP are connected to the OLB electrodes on the array substrate of the liquid crystal panel through the ACF, respectively. Each OLB electrode is connected to the signal line (data line) or gate line (scanning line) on the array substrate. The other terminal of the TCP is connected, by a soldering method, to the wiring on the printed substrate positioned in the circumference of the liquid crystal panel. In this way, the liquid crystal display of the structure shown in FIGS. 1 and 2 is fabricated.

Thus, as evident in the embodiment of the fabrication method of the present invention, the present invention is characterized in that the silicon resin, which was coated in the conventional module fabricating step, is not used at all. Instead, protective film of the circumferential wiring portion of the array substrate 2 is formed concurrently with the formation of black matrix in the cell step.

In accordance with the fabrication method of the present invention, only effort needed is to provide pattern for the protective film to protect the wiring on the circumferential portion of the array substrate on the mask pattern, which is used in the black matrix forming step. Therefore, the protective film can be formed without increasing the number of steps of conventional cell step. Moreover, the protective-film forming step in the module step can be omitted, and the entire number of steps can be reduced, as well as the silicon material can be saved.

The present invention is not limited to the aforementioned embodiment, but various modifications are possible.

For example, while in the aforementioned embodiment the present invention has been applied to the liquid crystal display of the so-called BM-on-array structure where a resin black matrix is formed on array substrate side, the present invention is not limited to this, but can be applied to a liquid crystal display where a black matrix is formed on the color filter side. But, in such a case, the present invention has a disadvantage that the pattern processing in the cell step is added, while having an advantage that a protective film which can sufficiently protect the wiring of the is circumferential portion of the array substrate from foreign substances and dewdrops can be obtained, also having a remarkable advantage of omitting the use of the silicon resin in the module fabricating step.

The present invention is not limited to the liquid crystal display, but it is, of course, applicable to a plasma display, a reflection type liquid crystal display formed on a silicon substrate, etc. In addition, the present invention is not limited to the active matrix type liquid crystal display, but may be applied to a simple matrix type liquid crystal display.

We claim:

1. A liquid crystal display comprising:

a wiring region formed on an array substrate;

a sealing layer provided between said array substrate and a substrate opposed to said array substrate to enclose liquid crystal; and a black resin film covering an otherwise exposed portion of said wiring region on the outside of said sealing layer to protect said portion of said wiring region from environmental damage.

2. The liquid crystal display as set forth in claim 1, wherein said black resin film comprises a resin film having dispersed black pigments.

3. The liquid crystal display as set forth in claim 1, wherein said black resin film comprises a resin film having dispersed carbon blacks.

4. A liquid crystal display comprising:

a wiring region formed on an array;

a sealing layer provided between said array substrate and a substrate opposed to said array substrate to enclosed liquid crystal; and a black resin film formed on said wiring region between said sealing layer and liquid crystal drive circuit connection section.

5. The liquid crystal display as set forth in claim 4, wherein said black resin film comprises a resin film having dispersed black pigments.

6. The liquid crystal display as set forth in claim 4, wherein said black resin film comprises a resin film having dispersed carbon blacks.

7. A method of fabricating a liquid crystal display, comprising the steps of:

forming a wiring layer on a substrate;

coating a black resin film on an entire surface of said substrate and patterning said black resin film to form a black matrix on an image display region of said substrate with one portion of the patterned black resin film and simultaneously to form a protective layer on said wiring layer in a region other than said image display region with another portion of the patterned black resin film, said black matrix functioning as a light-shielding film.

8. A liquid crystal display comprising:

an array substrate having an image display region, a sealing region surrounding said image display region for enclosing liquid crystal between the image display region and an opposing substrate, a liquid crystal drive circuit connection region outside of said image display region for making electrical connections to drive circuitry, and a region between said sealing region and said connection region through which conductors extend from the image display region to the connection region; and a black resin film substantially covering said region between said sealing region and said connection region to protect said conductors extending from said image display region to said connection region.

9. The liquid crystal display as set forth in claim 8, wherein said black resin film comprises a resin film having dispersed black pigments.

10. The liquid crystal display as set forth in claim 8, wherein said black resin film comprises a resin film having dispersed carbon blacks.

11. The liquid crystal display as set forth in claims 8, wherein said liquid crystal display includes a black matrix in the image display region and said black matrix and said black resin film are composed of identical material deposited at the same time.

* * * * *